(12) United States Patent
Benveniste

(10) Patent No.: US 7,598,505 B2
(45) Date of Patent: Oct. 6, 2009

(54) MULTICHANNEL ION GUN

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 614 days.

(21) Appl. No.: 11/074,434

(22) Filed: Mar. 8, 2005

(65) Prior Publication Data
US 2006/0219944 A1   Oct. 5, 2006

(51) Int. Cl.
*G21K 5/00* (2006.01)
(52) U.S. Cl. .............................. 250/492.21; 250/492.1; 250/492.2; 250/492.3
(58) Field of Classification Search ... 250/492.1–492.3, 250/396 R–396 ML
See application file for complete search history.

(56) References Cited

U.S. PATENT DOCUMENTS

| | | | | |
|---|---|---|---|---|
| 4,126,806 A * | 11/1978 | Kapetanakos et al. | ....... | 313/155 |
| 4,914,305 A * | 4/1990 | Benveniste et al. | ....... | 250/492.3 |
| 5,206,516 A * | 4/1993 | Keller et al. | ............. | 250/492.2 |
| 5,751,002 A * | 5/1998 | Ogata et al. | ............. | 250/492.21 |
| 5,760,405 A * | 6/1998 | King et al. | .............. | 250/423 R |
| 5,811,823 A * | 9/1998 | Blake et al. | ............. | 250/492.21 |
| 6,060,715 A * | 5/2000 | England et al. | ........ | 250/492.21 |
| 6,250,250 B1 * | 6/2001 | Maishev et al. | ....... | 118/723 ER |
| 6,423,976 B1 * | 7/2002 | Glavish et al. | ......... | 250/492.21 |
| 6,486,478 B1 * | 11/2002 | Libby et al. | .............. | 250/492.1 |
| 6,762,423 B2 * | 7/2004 | Liebert et al. | .......... | 250/492.21 |
| 6,777,882 B2 * | 8/2004 | Goldberg et al. | ....... | 315/111.81 |
| 6,800,863 B2 * | 10/2004 | Jun et al. | ................ | 250/492.21 |
| 6,825,482 B1 * | 11/2004 | Oh et al. | ................. | 250/492.21 |
| 6,835,930 B2 | 12/2004 | Benveniste et al. | | |
| 6,838,677 B2 | 1/2005 | Keller | | |
| 6,855,942 B2 | 2/2005 | Bechthold et al. | | |
| 6,881,966 B2 * | 4/2005 | Benveniste et al. | ..... | 250/492.21 |
| 6,956,225 B1 * | 10/2005 | Benveniste | ............. | 250/492.21 |
| 6,998,625 B1 * | 2/2006 | McKenna et al. | ...... | 250/492.21 |
| 7,109,499 B2 * | 9/2006 | Angel et al. | ........... | 250/492.21 |
| 2002/0043621 A1 * | 4/2002 | Aitken | ........................ | 250/281 |
| 2003/0146707 A1 * | 8/2003 | Goldberg et al. | ....... | 315/111.81 |
| 2004/0084635 A1 * | 5/2004 | Liebert et al. | .......... | 250/492.21 |
| 2004/0099818 A1 * | 5/2004 | Jun et al. | ................ | 250/492.21 |
| 2004/0227105 A1 * | 11/2004 | Benveniste et al. | ..... | 250/492.21 |
| 2005/0061997 A1 * | 3/2005 | Benveniste | ............. | 250/492.21 |
| 2005/0211668 A1 * | 9/2005 | Pandhumsoporn | ........... | 216/59 |
| 2005/0218343 A1 * | 10/2005 | Benveniste | ............. | 250/492.21 |
| 2006/0006346 A1 * | 1/2006 | Rathmell et al. | ....... | 250/492.21 |
| 2006/0097195 A1 * | 5/2006 | Angel et al. | ........... | 250/492.21 |

* cited by examiner

*Primary Examiner*—David A Vanore
*Assistant Examiner*—Andrew Smyth
(74) *Attorney, Agent, or Firm*—Eschweiler & Associates, LLC

(57) ABSTRACT

The present invention discloses systems and methods for generating low energy, high current ion beams by scaling beamline dimensions and employing multiple beamlines. An array of beamlets is generated by an ion source. The beamlets then pass through a mass analysis module that permits selected ions to pass while blocking other ions and/or particles. The selected ions can then be accelerated to a desired energy level. Subsequently, the beamlets are diverged in horizontal and vertical directions to form a single low energy, high current ion beam.

25 Claims, 9 Drawing Sheets

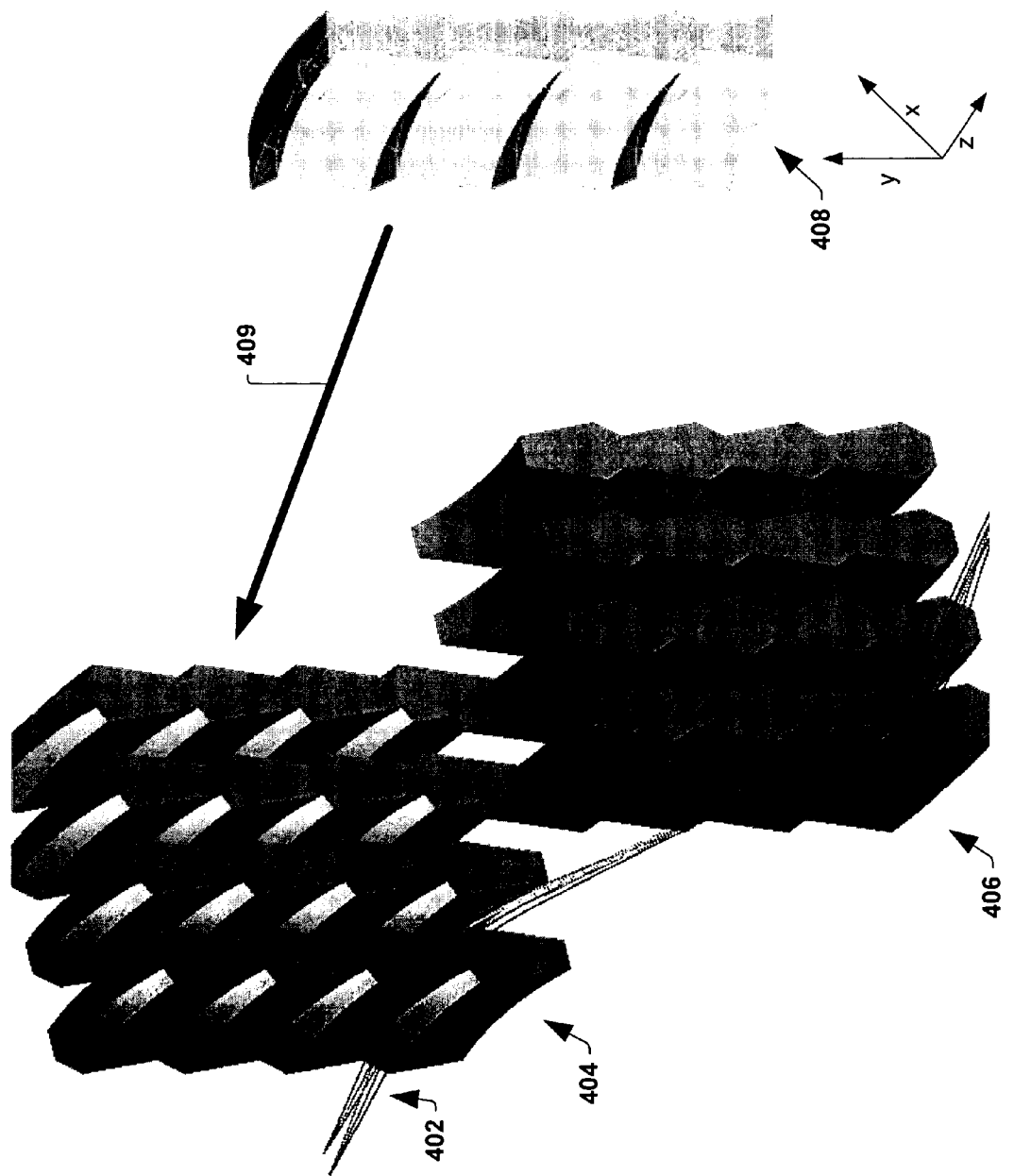

MULTICHANNEL ION GUN

FIELD OF THE INVENTION

The present invention relates generally to ion implantation systems, and more particularly to low energy, high current ion implantation systems and methods.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam of desired energy. The ion beam is then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

In order to achieve a desired implantation for a given application, the dosage and energy of the implanted ions may be varied. The ion dosage controls the concentration of implanted ions for a given semiconductor material. Typically, high current implanters are used for high dose implants, while medium current implanters are used for lower dosage applications. The ion energy is used to control junction depth in semiconductor devices, where the energy levels of the beam ions determine the degree to which ions are implanted or the depth of the implanted ions in the workpiece.

The continuing trend toward smaller and smaller semiconductor devices requires a mechanism, which serves to deliver high beam currents at low energies. The high beam current provides the necessary dosage levels, while the low energy permits shallow implants.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed towards systems and methods for generating low energy, high current ion beams by scaling beamline dimensions and employing multiple beamlines. An array of beamlets is generated by an ion source. The beamlets then pass through a mass analysis module that permits selected ions to pass while blocking other ions and/or particles. The selected ions can then be accelerated to a desired energy level. Subsequently, the beamlets are diverged in horizontal and/or vertical directions to form a single low energy, high current ion beam.

In accordance with one aspect of the present invention, a multi-channel ion implantation system is disclosed. The system comprises a beam source that generates a beamlet array and a beamline assembly that processes beamlets within the array. The beamline assembly comprises a mass analyzer module that operates on the beamlet array to remove ions having a non-selected mass energy product and permit selected ions, which are ions having a selected mass energy product, to pass through. The beamline assembly also comprises a beam formation component that causes the beamlets to sufficient diverge in one or both directions and form a single low energy, high current ion beam.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 4A is a perspective view of a mass analyzer module in accordance with an aspect of the present invention.

DETAILED DESCRIPTION OF THE INVENTION

Figure 1:
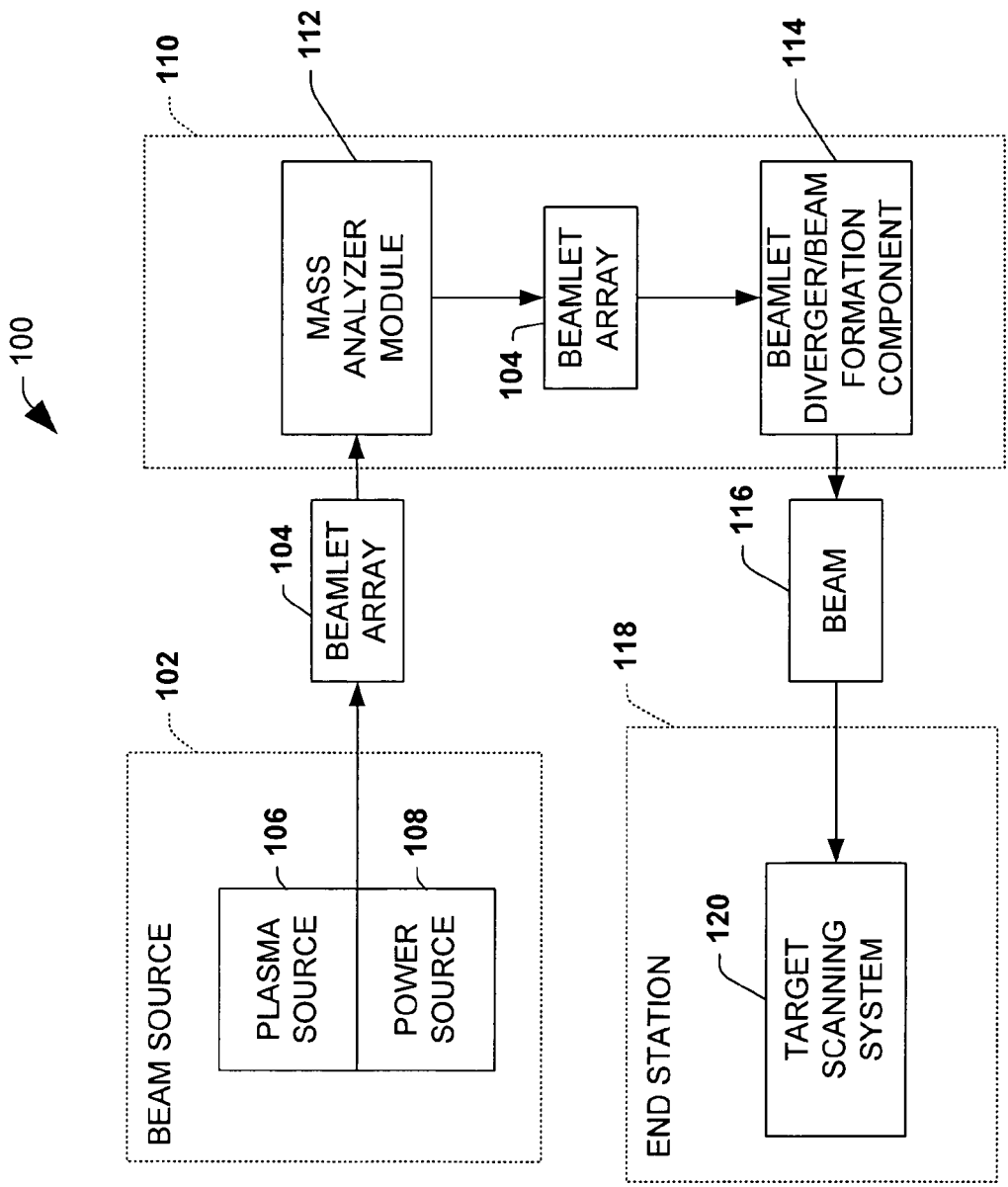
FIG. 1 is a block diagram of a multi-beamline ion implantation system in accordance with an aspect of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

Many ion implantations performed in current semiconductor or other fabrication processes are shallow and/or ultra-shallow implants that form shallow and/or ultra-shallow junction depths in formed devices. These shallow and/or ultra-shallow implants typically employ low energies (e.g., 1 keV), but require relatively high beam current (e.g., 20 to 30 milli amps). Generally, it is appreciated that high current, low energy ion beams are obtained by extracting the ion beam from an ion source at a relatively high energy. Then, the ion beam is mass analyzed/purified and transported to a position relatively close to a target wafer. Subsequently, the ion beam is decelerated to a selected low energy level and is then transported to the target wafer or workpiece.

Conventional low energy ion implantation devices can have difficulty providing relatively high ion beam current at low energies. Problems, such as increased space charge, energy contaminants, and the like, have a negative impact on the productivity of the conventional low energy implanters. Some conventional techniques have been employed that attempt to mitigate the problems, but some fundamental limitations remain and achievable beam currents for single ion beams may not satisfy the requirements of next generation semiconductor processes.

The present invention facilitates low energy ion implantation by employing arrays of scaled beamlines that collectively provide a low energy, high current ion beam. The individual scaled beamlines are not subject to all of the difficulties and/or problems, such as those identified above, that can impact a conventional single ion implantation device. The present invention exploits the scaling laws of the processes that govern the formation and transport of ion beams in order to generate a collective ion beam without the above problems.

The inventor of the present invention appreciates that ion beam trajectories, from the formation at a plasma boundary, to the final target are substantially scale independent. For example, the equations relevant for ion beam transport, Maxwell's equations (1), motion (2), and charge distribution (3), shown below are scale independent.

$$\nabla^2 V = -\frac{J}{\varepsilon_o v}, \nabla^2 \bar{A} = -\frac{\bar{J}}{\mu_o}, V, \bar{A}, \bar{J}, \bar{v}(x, t) \quad (1)$$

$$e(-\nabla \cdot V + \bar{v} \otimes \nabla \otimes \bar{A}) = m \frac{\partial \bar{v}}{\partial t} \quad (2)$$

$$n_e/n_0 = e^{\frac{-KT}{e}\frac{1}{V-V_0}} \quad (3)$$

As a result, the scale of a beamline (e.g., beam size, beamline length, bending radius, and the like) can be arbitrarily adjusted up or down while preserving ion beam current, voltages, and shape. Thus, the present invention employs arrays of scaled (reduced) beamlines that together provide a low energy, high current ion beam. Generally, voltages, currents, and vector potentials are maintained constant. Physical component and path dimensions can be scaled, while frequencies scale inversely to dimensions. Some exceptions are non-linear mediums, loss processes, and relativistic motions. Some items that change linearly (inversely) with scaling include electric fields, magnetic fields, and neutral pressure. Some items that change with square of scaling (inversely) include current densities and charge densities.

Referring initially to FIG. 1, a multi-beamline ion implantation system 100 in accordance with an aspect of the present invention is depicted in block diagram form. The system 100 employs a beamlet array 104 comprised of a plurality of beamlets, which are scaled down ion beams. The system 100 performs mass analysis and possibly other transport operations on the beamlets individually in order to mitigate typical problems encountered with conventional low energy ion beam implanters. Generally, the beamlets are a fraction of a desired beam (e.g., 1/10) and, as a result, dimensions of components within the system are also that fraction of a conventional or single beamline ion beam implantation system.

The system 100 includes an ion source 102 for producing a beamlet array 104 by using triode extraction, for example. The ion beam source 102 includes, for example, a plasma source 106 with an associated power source 108. The plasma source 106 may, for example, comprise a relatively long plasma confinement chamber from which the beamlet array 104 is extracted. The beamlet array 104 is comprised of a plurality of beamlets of similar size and with a spacing. Typically, the beamlet array 104 comprises a number of horizontal rows of beamlets. Elongated horizontally slits (not shown) can be employed to form beamlets elongated in the horizontal direction, which can facilitate horizontal merging of the beamlets.

A beamline assembly array 110 is provided downstream of the ion source 102 to receive the beamlet array 104 therefrom. The beamline assembly array 110 includes a mass analyzer module 112 and beam formation component 114. Other components may be present therein and still be in accordance with the present invention. The beamline assembly array 110 is situated along the path to receive the beamlet array 104 and generates a single low energy, high current ion beam 116 at full scale.

The mass analyzer module 112 comprises an array of mass analyzers having channels therein that allow individual beamlets to pass there through. Generally, the mass analyzers respectively comprise a pair of permanent magnets that form a channel there between. Adjacent channels typically share one of the pair of magnets. However, it is appreciated that the mass analyzer module 112 can have other configurations of mass analyzers, such as including multiple pairs of magnets per beamlet, an example of which is described in later figures.

As stated above, scaling dimensions of beamline components requires an inverse scaling in magnetic fields. For example, a 1/10 scaling in dimensions (e.g., beamline length, bending radios, beam size, and the like) requires a 10× increase in magnetic fields for the mass analyzers. Consequently, permanent magnets can be required for small dimensions in order to provide a sufficient and consistent magnetic field.

The channels within the mass analyzer module can be physically maintained by using beamguide spacers (not shown), which prevent individual magnets from physically moving and occupying the channels. The dimensions of the permanent magnets employed are relatively small, which may cause other separation mechanisms to be difficult to employ. Each magnet has a north and south pole that can attract neighboring magnets. Without a sufficient separation mechanism, such as beamguide spacers, the channels can become collapsed.

The respective mass analyzers of the module 112 provide a magnetic field across the channels such that the paths of ions having a selected mass energy product is curved and passes through the respective channels. One or more slits or apertures may be present that block ions or particles having non-selected mass energy products. As a result, the mass analyzer module 112 substantially removes ions or particles from the beamlet array 104 that do not have the selected mass energy product.

The selected mass energy product of the mass analyzer module 112 is generally fixed due to using permanent magnets, which provide a fixed, non-varying magnetic field. However, the present invention contemplates employing replaceable modules of permanent magnets that can be employed to obtain different magnetic fields, and as a result, different mass energy products for mass analysis of different dopant species.

A beam formation component 114 is located downstream of the mass analyzer array 112 and forms a single beam 116 from the mass analyzed beamlet array 104. The beam formation component 114 causes the beamlets within the array 104 to diverge in horizontal and/or vertical directions so as to form the single beam 116.

The optical properties of the extraction and the magnets, are such that the beamlets enter the post resolving drift space with some divergence. The divergence causes the beam to expand throughout the drift space.

Additionally, because of the space-charge force, the lateral spread of an ion beam is proportional to:

$$(\sqrt{m}/\sqrt{q}) \times (Iz^2/U^{3/2})$$

where m is an ion mass, q is an ion charge, I is a beam current, U is beam energy, and z is the traveling distance of the ion beam, assuming that the ion beam is uniform and has a circular cross section.

The beam formation component 114 can employ these lateral spreads and the traveling distance to sufficiently diverge the beamlets in one or both directions. Alternately, the beam formation component can employ deflection plates to enhance divergence. Such deflection plates are located on horizontal and/or vertical planes and are biased to enhance deflection in a single axis. Another mechanism that can be employed by the beam formation component 114 is to perform mechanical scanning. The beamline assembly 110 and/or a target are moved in horizontal and/or vertical directions in order to spread coverage of a generated beam across a workpiece.

In one example, the beam formation component 114 causes the beamlets to diverge in a horizontal direction by employing a drift region wherein the ions within the beamlets diverge sufficiently to cause rows of beamlets to merge together. The beam formation component 114 also employs a mechanism to cause the beamlets to diverge in the vertical direction. As with the horizontal direction, a drift region can also be used to allow sufficient divergence of the beamlets in the vertical direction. However, the beamlets may be shaped to widen more in the horizontal direction (horizontally elongated). In such a case, a suitable drift region could require relatively long length thereby making employment of a drift region for vertical divergence impractical. Alternately, vertical deflection plates, which lie in horizontal planes between paths of rows of beamlets, can be employed and biased so as to enhance divergence in the vertical direction. In one example, the vertical deflection plates are alternately biased positive and negative values.

An end station 118 is also provided in the system 100 to receive the resultant single ion beam 116 from the beamline assembly 110. The end station 118 supports one or more workpieces such as semiconductor wafers (not shown) along the beam path for implantation using the mass analyzed decontaminated ion beam 116. The end station 118, in one example includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

It is appreciated that the system 100 of FIG. 1 is described at a high level in order to facilitate a greater understanding of the present invention. Further details of suitable components that can be employed in the system 100 are described infra. Variations in the components described above as well as additional components can be employed in accordance with the present invention.

As an example, consider a typical low energy ion beam of 100 eV, which has a beam current of about 30 microamps. Scaling the beamline by 1/10, including beam size, beamline length, and bending ratios, increasing the magnetic fields and background pressure by a factor of 10 still results in a beam current of 30 microamps. Continuing the example, if 700 of these scaled beamlets are employed in the system 100, a total beam current of about 20 milliamps at the low energy can be obtained.

Figure 2:
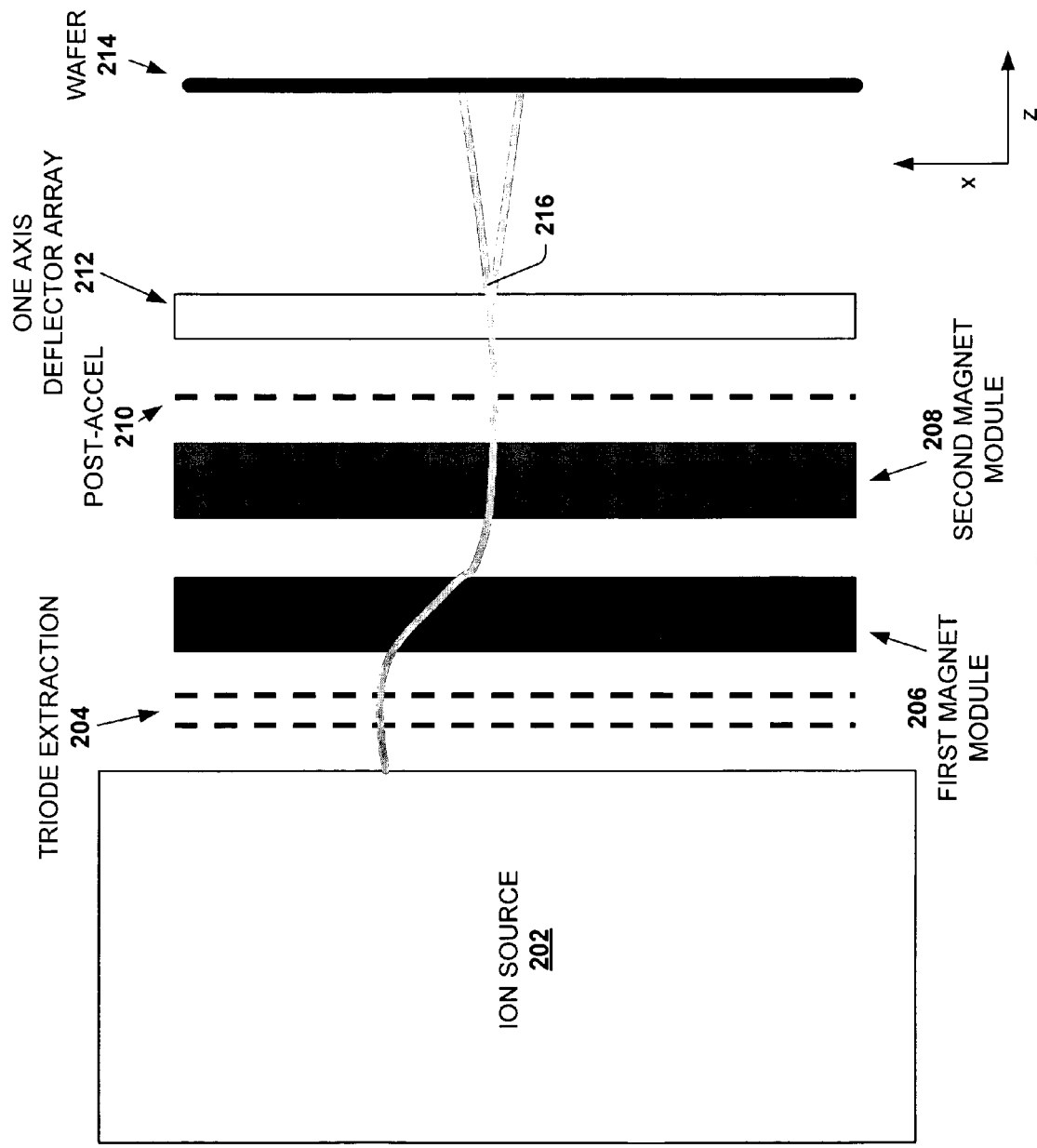
FIG. 2 is a vertical view of a multi-channel, multi-beamline ion implantation system in accordance with an aspect of the present invention.

FIG. 2 is a vertical or plan view of a multi-channel, multi-beamline ion implantation system in accordance with an aspect of the present invention. The system is a multi-channel, multi-beamline ion implantation system that generates a beamlet array that, after passing through the multiple channels, is formed into a single beam.

The system comprises an ion source 202, a triode extraction assembly 204, a first magnet module 206, a second magnet module 208, a post acceleration assembly 210, and a single axis deflector array 212. The ion source 202 comprises, in one example, a plasma source and a power source. The plasma source can comprise a relatively long plasma confinement chamber. The triode extraction assembly 204 is positioned downstream of the ion source 202 and extracts a beamlet array from the ion source 202. The n×m beamlet array comprises n horizontal rows and m vertical columns of beamlets. Slits, which may be part of the triode extraction assembly 204, are typically employed to form and shape the beamlets of the array. In one example, the slits are elongated in the horizontal direction, which generates beamlets elongated in the horizontal direction and allows for quicker overlap between beamlets of the array in the horizontal direction.

The first magnet module 206 receives the beamlet array from the triode extraction assembly 204 and performs a first mass analysis on the beamlet array. The first magnet module 206 comprises an array of channels in between pairs of permanent magnets that permit passage of individual beamlets there through. The pairs of magnets cause ions having a selected mass energy product to bend at a first angle (e.g., 45 degrees) in a horizontal direction. Other ions and particles having differing mass energy products bend at other angles and can impact sides of the channels. In addition, an array of slits can be positioned after the first magnet module 206 to block ions and/or particles having non-selected mass energy products. Consequently, the first magnet module 206 operates as a first pass or first order mass energy product filter that substantially "purifies" the ion beam.

The second magnet module 208 is positioned downstream of the first magnet module 206, receives the beamlet array and performs a second mass analysis on the beamlet array. The second magnet module 208 also comprises an array of channels in between pairs of permanent magnets that permit passage of individual beamlets there through. The pairs of magnets cause ions having a selected mass energy product to bend at a second angle (e.g., 45 degrees) in a horizontal direction, typically opposite the first angle. Other ions and particles bend at other angles and can impact sides of the channels. In addition, a second array of slits can be positioned after the second magnet module 208 to block ions and/or particles having non-selected mass energy products. The second magnet module 208 acts as a second pass mass energy product filter to further purify the beam.

The post acceleration assembly 210 is positioned downstream of the second magnet module 208 and serves to accelerate (includes accelerating and decelerating) the beamlet array to a final energy value. The post acceleration assembly 210 comprises a number of electrodes positioned along a path of the beamlet array. The electrodes are biased so as to accelerate to the final energy value.

A single axis deflector array 212 is positioned downstream of the post acceleration assembly 210 and operates to diverge the beamlet array in the vertical direction. Generally, a number of deflection plates on horizontal planes associated with the n rows of beamlets are employed. Plates are positioned in between the horizontal rows of beamlets. The deflection plates are alternately biased such that adjacent plates have an opposite polarity. The magnitude and/or frequency of biasing controls the amount of vertical divergence to be obtained. As a result, the biased plates cause the beamlets to diverge in a vertical direction such that columns of beamlets form together. Alternately, a drift region could be employed.

A drift region (not shown) is present that sufficiently diverges the beamlet array in a horizontal direction (x). As described above, ions within a beam tend to diverge as they travel. Low energy beams tend to diverge more so than higher energy beams over a given distance. As a result, a particular length or drift region length is employed to provide sufficient horizontal divergence. This length of the drift region can be relatively short, particularly if the beamlets are elongated in the horizontal direction, thereby facilitating quicker overlap of beamlets in the horizontal direction. Thus, horizontal rows of beamlets form into a single beam. The drift region, in combination with the single axis deflector array 212 causes the beamlet array to form into a single low energy, high current ion beam 216. A target 214, such as a wafer, multiple wafers, arrangement for a flat panel implantation, and the like is present at an end station and the ion beam is directed towards it to perform ion implantation.

Figure 3:
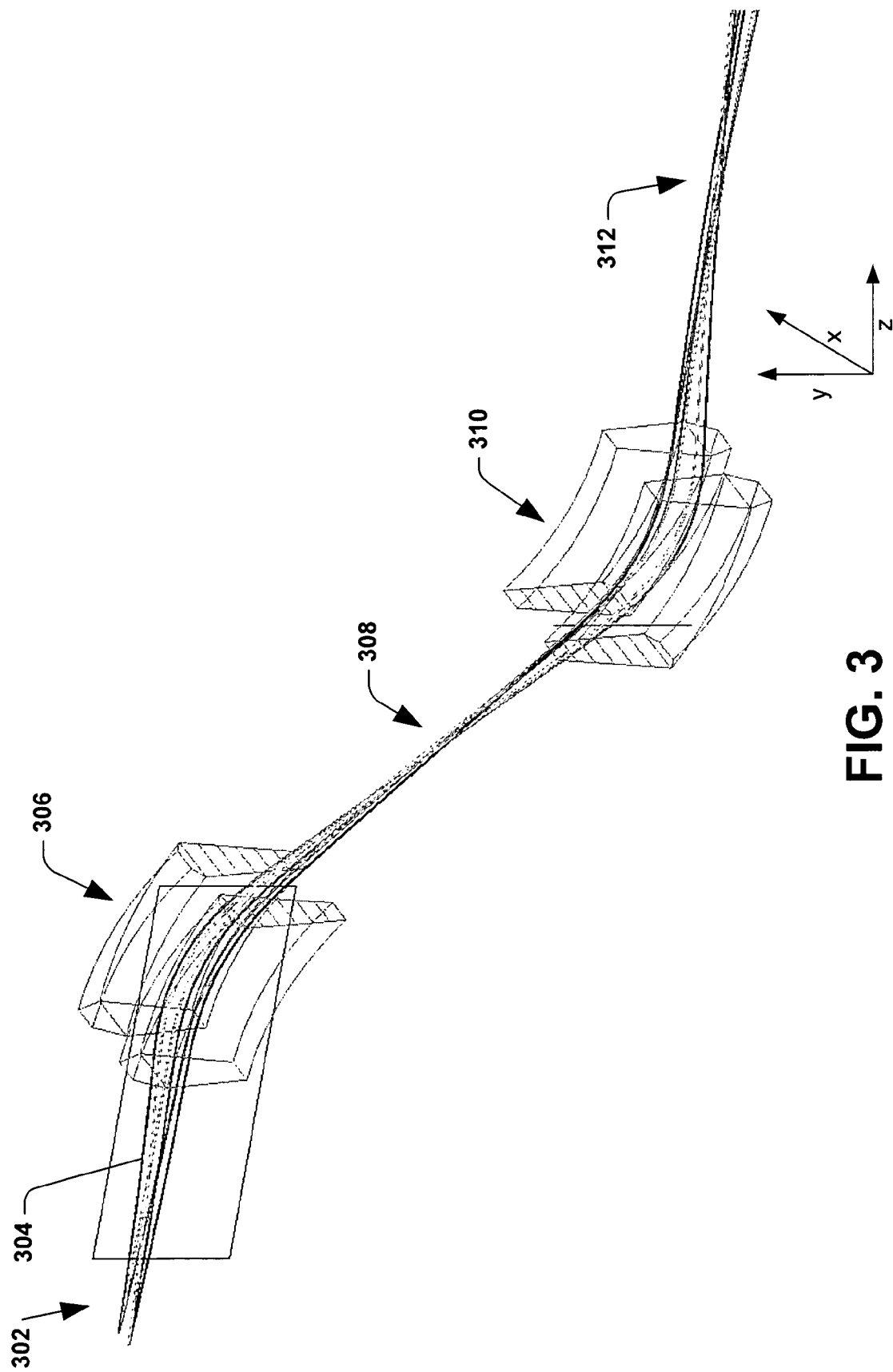
FIG. 3 is a perspective view of a single channel through which an individual ion beamlet passes in accordance with an aspect of the present invention.

FIG. 3 is a perspective view of a single channel 302 through which an individual ion beamlet 304 passes in accordance with an aspect of the present invention. The beamlet 304 is part of an array of beamlets (not shown) that are employed to later form a single low energy, high current ion beam.

A first magnet pair 306 and a second magnet pair 310 are shown with the channel 302 passing there through. The first magnet pair 306 deflects the beamlet 304 by a first angle in a horizontal (x) direction. Ions within the beamlet 304 having a selected mass energy product pass through the first magnet pair. Other ions within the beamlet 304 can be blocked by a first slit (not shown), but positioned at 308. Continuing, the second magnet pair 310 deflects the beamlet 304 by a second angle in a horizontal direction. Generally, the second angle is opposite, but equal to the first angle. Ions within the beamlet 304 having the selected mass energy product pass through the second magnet pair. Other ions within the beamlet 304 can be blocked by a second slit (not show), positioned at 312. Generally, the second slit has a higher mass resolution than the first slit.

The first magnet pair 306 and the second magnet pair 310 are depicted as having trapezoidal cross sections in FIG. 3. This shape can facilitate passage of the beamlet 304 through the channel. However, it is appreciated that the present invention includes other shapes for the pairs of magnets and that the shape depicted in FIG. 3 is exemplary in nature. Additionally, the first magnet pair 306 and the second magnet pair 310 are generally permanent magnets in order to generate a sufficient magnetic field.

FIG. 4A is a perspective view of a mass analyzer module 400 in accordance with an aspect of the present invention. The view depicts the module 400 as including an array of channels between pairs of permanent magnets through which an array of beamlets pass. More particularly, the view depicts a beamlet 402 passing through the mass analyzer module 400.

The module 400 comprises a first array of magnets 404 and a second array of magnets 406. Due to the size of the arrays, channels, and beamlets, the magnets are typically permanent magnets in order to generate a sufficient magnetic field. The beamlet 402 is shown passing through a channel in the first array 404 and on through the second array 406.

Beamguide spacers 408, in one example, are positioned 409 in between the columns of permanent magnets in order to properly position the magnets within the arrays. The spacers 408 are comprised of a non-magnetic material, such as aluminum, that is structurally sufficient to prevent magnets from physically moving. As a result, the spacers 408 permit the sufficient magnetic field to be generated in a non-varying manner between pairs of magnets.

The beamguide spacers 408 have channels formed therein (in a z direction) through which the beamlets may pass. The channels can be formed in a number of suitable ways, such as by drilling from opposite ends of the spacers 408. The size and shape of the channels formed therein can also block ions and/or particles having non-selected mass energy products from passing through the arrays and channels.

Figure 4B:
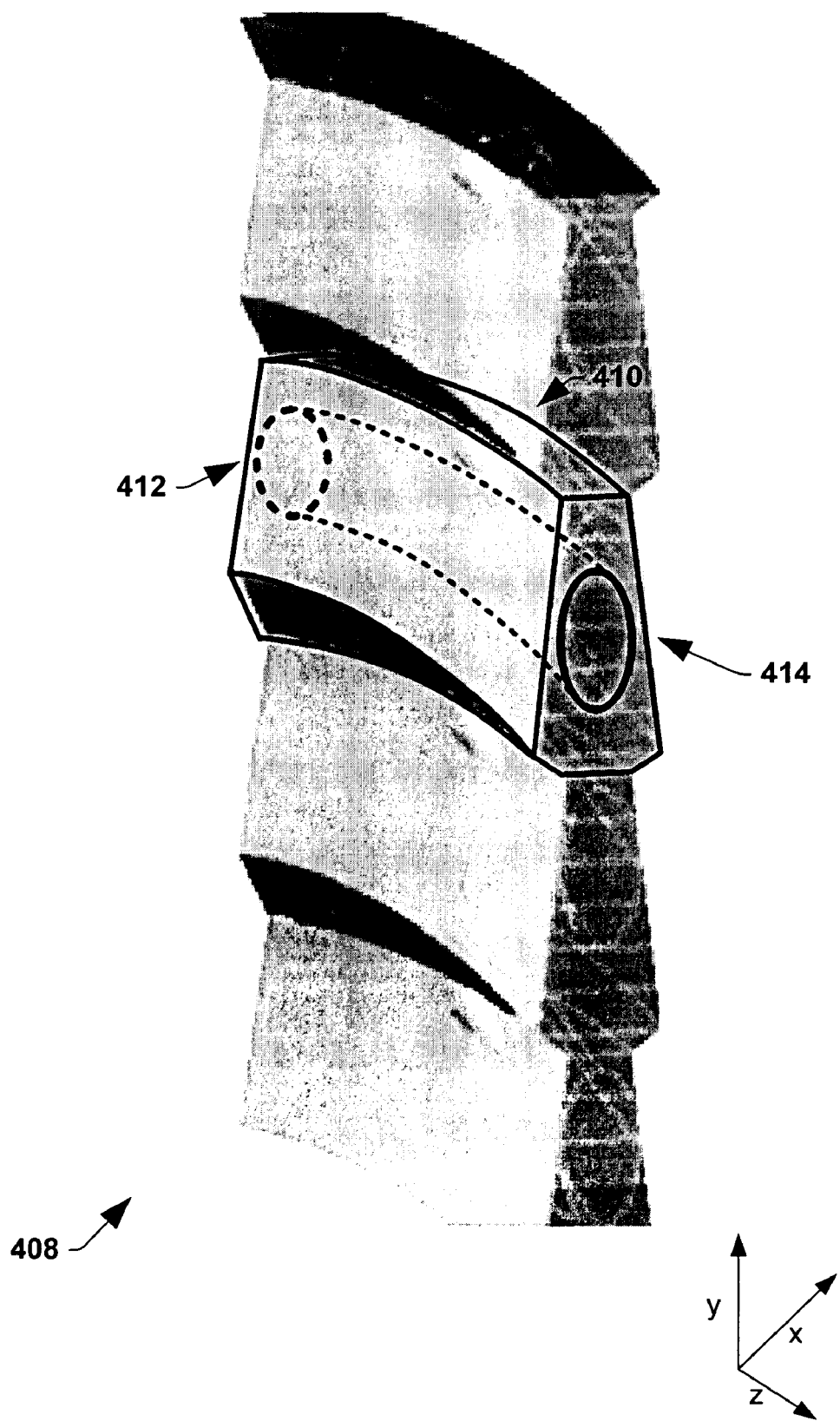
FIG. 4B is another view of the beamguide spacers in accordance with an aspect of the present invention.

FIG. 4B is another enlarged view of the beamguide spacers 408 in accordance with an aspect of the present invention. In this view, attention is drawn toward a single channel 410 formed within a single spacer. The channel 410 can be formed, in this example, by drilling through spacer material at 412 and 414 in order to form the channel 410 continuously through the spacer. It is appreciated that the channel 410 is exemplary in nature and that the present invention contemplates other size and shapes of channels formed within spacer material.

Figure 5:
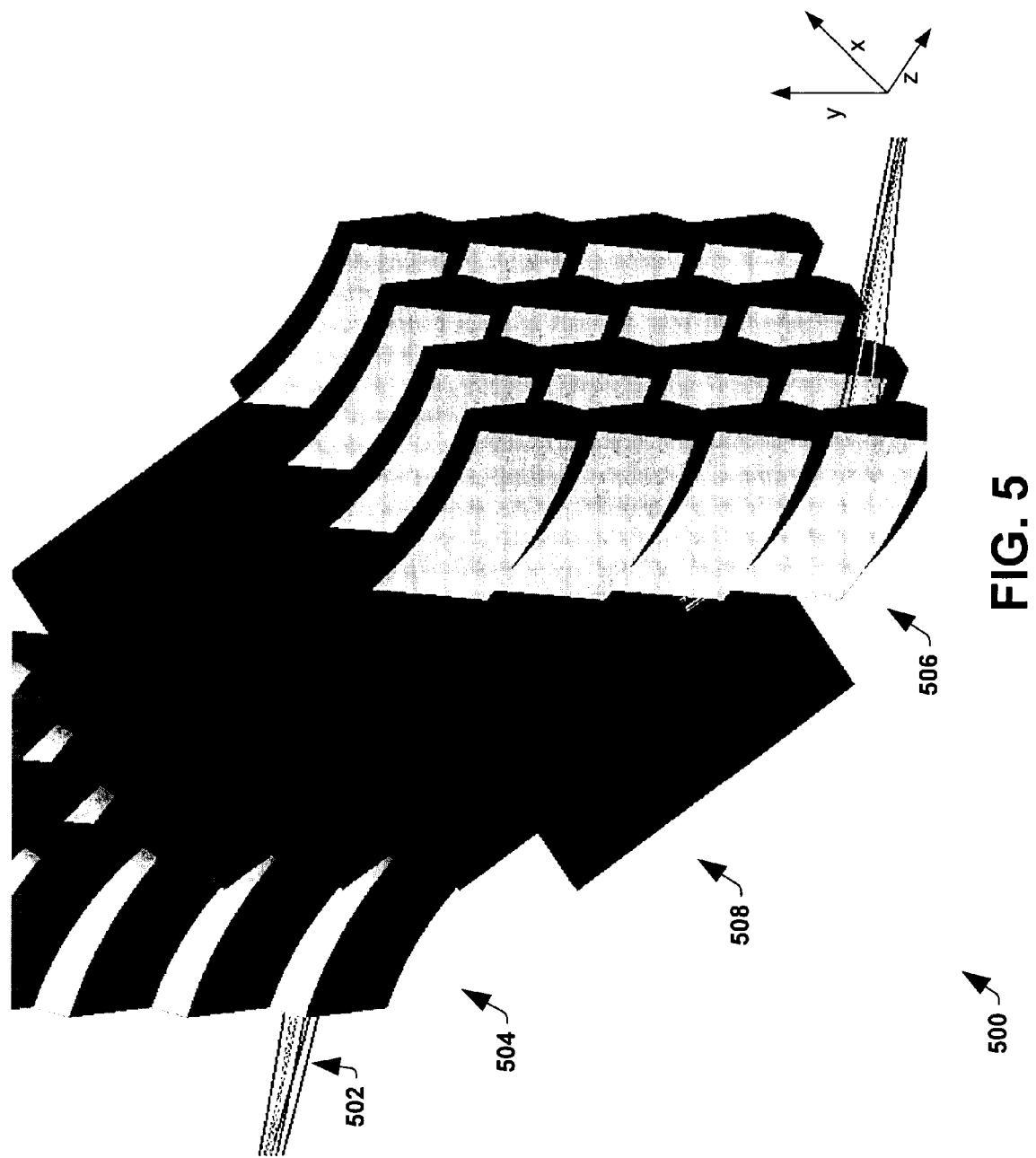
FIG. 5 is a perspective view of another mass analyzer module that includes partition strips in accordance with an aspect of the present invention.

FIG. 5 is a perspective view of another mass analyzer module 500 that includes partition strips 508 in accordance with an aspect of the present invention. The view depicts the module 500 as including an array of channels between pairs of permanent magnets through which an array of beamlets pass. The module 500 is similar to the module 400 described in FIG. 4, but additionally includes the partition strips 508 to block cross-channel transport.

The module 500 comprises a first array of magnets 504 and a second array of magnets 506. Due to the size of the arrays, channels, and beamlets, the magnets are typically permanent magnets in order to generate a sufficient magnetic field. The beamlet 502 is shown passing through a channel in the first array 504 and on through the second array 506.

One potential problem that can occur with the first array of magnets 504 is that ions and/or particles with non-selected mass energy products may be prevented from continuing through a current channel through the second array 506, but may deflect so much that they pass through another channel, such as one above or below it. As a result, horizontal partition strips 508 are employed to mitigate or stop this cross channel transport. The partition strips 508 are typically comprised of an electrically neutral material so as not to interfere with the beamlets traveling through the channels. However, as described below, an alternate aspect of the present invention employs electrodes formed on upper and lower surfaces of the partition strips that can be employed to enhance uniformity of a generated single ion beam, as will be discussed in greater detail infra.

Figure 6:
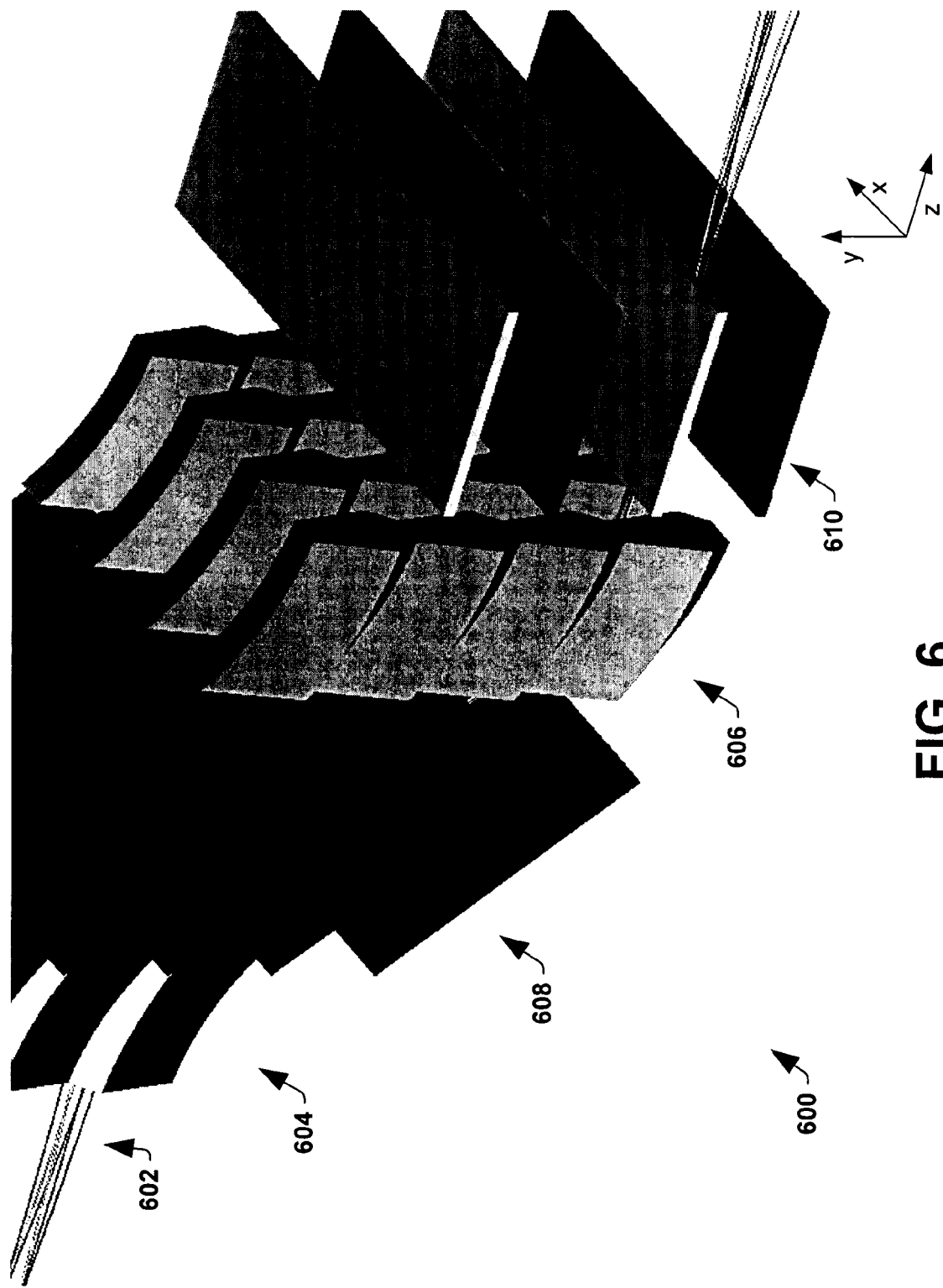
FIG. 6 is a perspective view of yet another mass analyzer module that includes deflection plates in accordance with an aspect of the present invention.

FIG. 6 is a perspective view of yet another mass analyzer module 600 that includes deflection plates 610 in accordance with an aspect of the present invention. The view depicts the module 600 as including an array of channels between pairs of permanent magnets through which an array of beamlets pass. The module 600 is similar to the module 500 described in FIG. 5, but additionally includes the deflection plates 610 in order to sufficiently diverge the array of beamlets in a vertical direction (y).

The module 600 comprises a first array of magnets 604 and a second array of magnets 606. Due to the size of the arrays, channels, and beamlets, the magnets are typically permanent magnets in order to generate a sufficient magnetic field. The beamlet 602 is shown passing through a channel in the first array 604 and on through the second array 606. Horizontal partition strips 608 are employed between the first array of magnets 604 and the second array of magnets 606 in order to mitigate or stop cross channel transport. The partition strips 608 are typically comprised of an electrically neutral material so as not to interfere with beamlets traveling through the channels.

The vertical deflection plates 610 are positioned downstream of the second array of magnets 606. Individual plates separate rows of generated beamlets and are biased with an opposite polarity of adjacent plates. As a result, the vertical deflection plates 610 cause beamlets, including the beamlet 602, to sufficiently diverge (or scan) in the vertical direction so as to form continuous ion beams, in the vertical direction. Typically, a drift region is employed to provide sufficient divergence in a horizontal (x) direction. As a result, a single, continuous low energy, high current ion beam can be formed at the workpiece.

Figure 7:
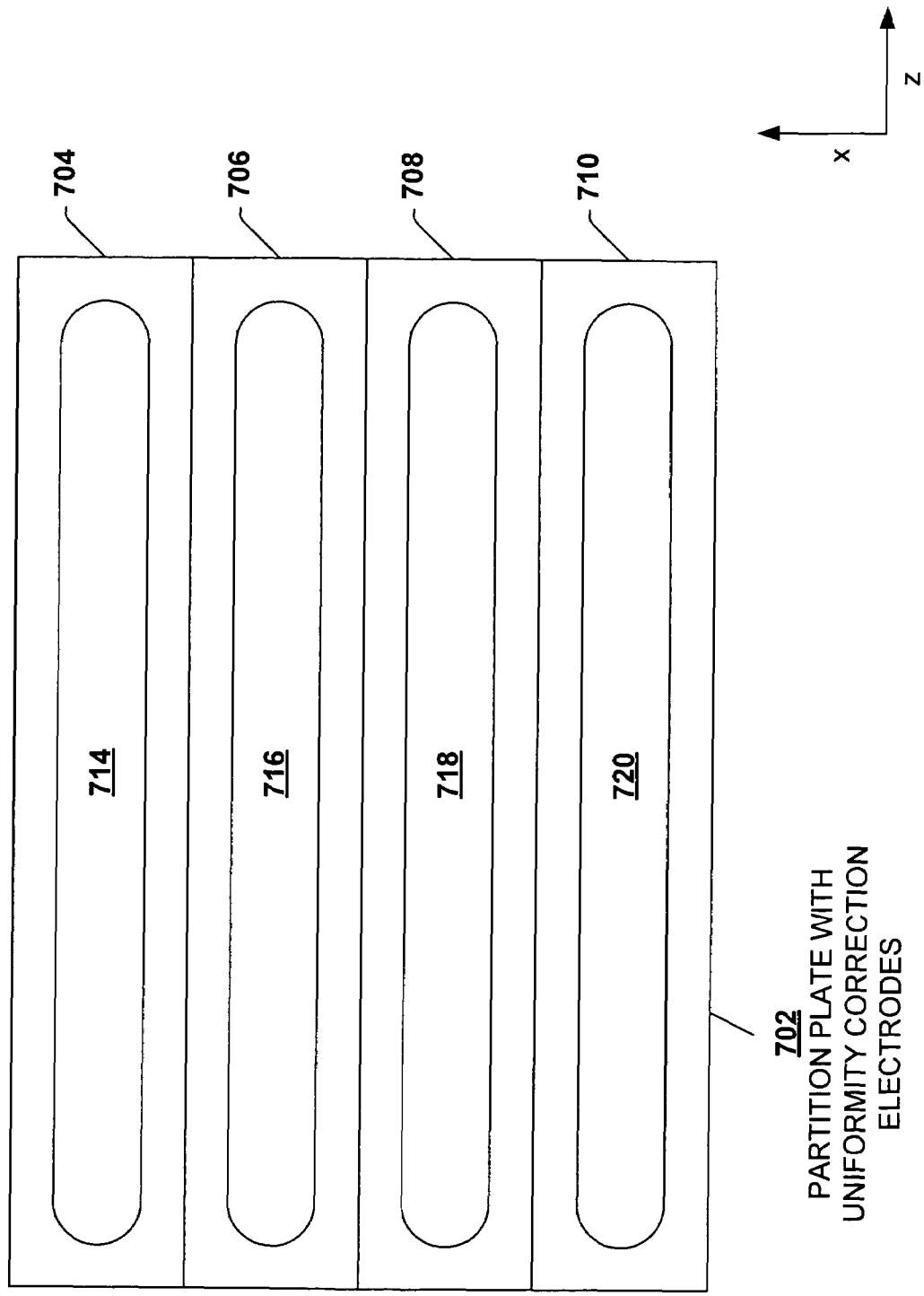
FIG. 7 is a plan view of a partition plate with uniformity correction electrodes in accordance with an aspect of the present invention.

FIG. 7 is a diagram of a partition plate 702 with uniformity correction electrodes in accordance with an aspect of the present invention. The partition plate 702 is typically employed between the mass analyzer modules, such as those described above, to prevent or mitigate cross channel transport. The partition plate 702 is exemplary in nature and is provided as an example to facilitate a better understanding of the invention.

A single side of the partition plate 702 is shown with four separate beamlet regions, 704, 706. 708, and 710, near which beamlets pass from one array of magnets to another. Generally, the number of regions would correspond to the number of columns m. Each of the beamlet regions has an associated electrode 714, 716, 718, and 720 formed therein. The electrodes, in one example, are individually controllable. An adjacent plate (not shown) above or below the plate 702 is also present and similarly configured with electrodes. By selectively applying potentials to the electrodes on the plate 702 and the adjacent plate, electric fields specific to individual beamlets can be generated.

A controller or other mechanism can control the fields through which the individual beamlets pass in order to adjust the beam current of individual beamlets. For example, by applying a positive voltage to the electrode 714 and a lower voltage to a corresponding electrode on the adjacent plate, beam blow up for that beamlet occurs thereby reducing its current after it passes through the second array of magnets. The applied voltages can also be time varying with selectable duty cycles in order to more fully control generated beam current.

As a result, beam current of a generated low energy, high current ion beam can be measured at a target (e.g., wafer, multiple wafers, flat panel arrangement, and the like) or end station and analyzed. Subsequently, the controller can employ electrodes on the plates to modify and/or control beam current uniformity.

In view of the foregoing structural and functional features described supra, methodologies in accordance with various aspects of the present invention will be better appreciated with reference to the above figures and descriptions. While, for purposes of simplicity of explanation, the methodologies described below are depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features may be required to implement a methodology in accordance with an aspect the present invention.

Figure 8:
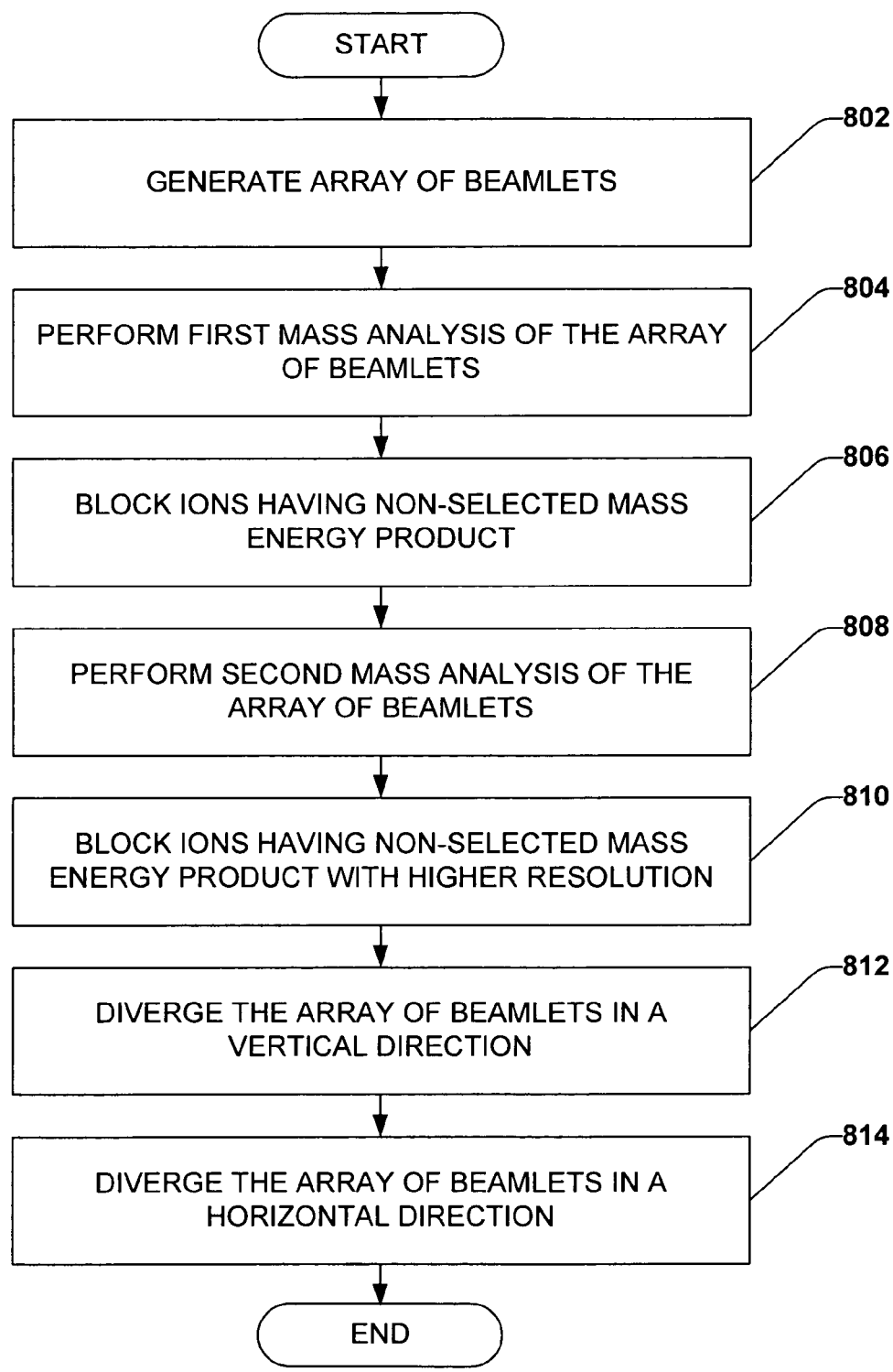
FIG. 8 is a flow diagram illustrating a method for generating a low energy, high current ion beam in accordance with an aspect of the present invention is disclosed.

Referring now to FIG. 8, a flow diagram illustrating a method 800 for generating a low energy, high current ion beam in accordance with an aspect of the present invention is disclosed. The method 800 generates an array of beamlets, performs beamline operations on individual beamlets, and then combines the beamlets to form a single low energy, high current ion beam.

As stated previously, voltages, currents, vector potentials, and the like employed in beamline assemblies are scale independent. As a result, dimensions of ion beams can be reduced and yet still produce smaller ion beams, referred to as beamlets that have the same beam current as without reduction. Subsequently, these beamlets can be combined together adding beam currents for the beamlets into a relatively high current, low energy single ion beam.

The method 800 begins at block 802, wherein an array of beamlets is generated. A plasma source and power source are employed with an extraction assembly to generate the array of beamlets. Horizontal slits, which are elongated in a horizontal direction, can be employed to shape the beamlets so that they are themselves elongated in the horizontal direction. The array of beamlets is comprised of a number of rows and columns and is substantially comprised of a selected ion species, such as boron or phosphorous, traveling with a selected energy. As a result, the selected ion species has a mass energy product. Individual beamlets are generally, but not necessarily, shaped wider or elongated in a horizontal direction.

A first mass analysis of the array of beamlets is performed at block 804, wherein the beamlets are subjected to a magnetic field that causes the selected ions, having the desired mass energy product, to deflect at a first angle (e.g., 45 degrees, 30 degrees, and the like) in a horizontal direction. Other ions and/or particles either fail to deflect or deflect at an angle other than the first angle.

The other ions and/or particles are substantially blocked at 806 by a blocking mechanism, which blocks ions and/or particles that deflect at angles other than the first angle for the beamlets within the array. The blocking mechanism can include a size and/or shape of channels formed through beamguide spacer materials and/or an appropriately sized slit, as described above.

A second mass analysis of the array of beamlets is performed at block 808, wherein the beamlets are subjected to a second magnetic field that causes the selected ions, having the desired mass energy product, to deflect at a second angle in the horizontal direction. Other ions and/or particles either fail to deflect or deflect at an angle other than the second angle. The second angle is generally opposite, but equal to the first angle.

The other ions and/or particles are again substantially blocked at 810 by a second blocking mechanism, which blocks ions and/or particles that deflect at angles other than the second angle for the beamlets within the array. The blocking mechanism can include a size and/or shape of channels formed through beamguide spacer materials and/or an appropriately sized slit, as described above.

The array of beamlets are diverged or scanned in a vertical direction at block 812, wherein columns of beamlets are merged into single column beams. Typically, deflection plates are employed to cause sufficient deflection. Alternately, a suitably long drift region can be employed to obtain sufficient deflection. Additionally, mechanical scanning of an end station and/or target in the vertical direction can also be employed.

The array of beamlets are diverged in a horizontal direction at block 814, wherein rows of beamlets are merged in single row beams and, a single low energy, high current ion beam. Generally, a suitably long drift region can be employed to obtain sufficient deflection in the horizontal direction, due to the shape of the beamlets. However, vertical deflection plates and/or mechanical scanning in the horizontal direction can also be employed.

It is appreciated that alternate aspects of the method 800 are contemplated that include other functionality discussed with respect to other figures, such as mitigating cross channel transport, accelerating the beamlets, and the like. Additionally, variations of the method 800 are permitted in accordance with the present invention, such as performing only a single mass analysis or more than to mass analysis.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In this regard, it will also be recognized that the invention may include a computer-readable medium having computer-executable instructions for performing the steps of the various methods of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A multi-channel ion implantation system comprising:
a beam source that generates a beamlet array; and
a beamline assembly that comprises:
a mass analyzer module that operates on the beamlet array to remove ions having a non-selected mass energy product; and
a beam formation component that combines the beamlet array into a single ion beam after the ions having the non-selected mass energy product have been removed from the beamlets.

2. The system of claim 1, wherein the mass analyzer module comprises a first array of magnets defining channels between pairs of magnets through which the beamlets travel subjected to magnetic fields, wherein the first array of magnets deflect the beamlet array by a first angle.

3. The system of claim 2, wherein the mass analyzer module further comprises a slit that blocks the ions having the non-selected mass energy product and passes ions having a selected mass energy product.

4. The system of claim 1, wherein the beam formation component comprises vertical deflection plates positioned between rows of beamlets of the array that cause the beamlets to diverge in a vertical direction.

5. The system of claim 1, wherein the beam formation component comprises a scanning mechanism that scans the beamlets in a vertical direction.

6. A multi-channel ion implantation system comprising:
a beam source and triode extraction assembly that generate a beamlet array; and
a beamline assembly comprising an array of channels through which the beamlet array passes, the beamline assembly comprising:
a first array of magnets comprised of pairs of permanent magnets defining a first magnetic field between the pairs of magnets;
first beamguide spacers positioned in between columns of the first array of magnets, wherein the first beamguide spacers comprise channels through which the beamlet array passes;
a first slit positioned downstream of the first array of magnets and having a first resolution that permits passage of ions having a selected mass energy product and substantially blocks other ions having a non-selected mass energy product;
horizontal partition plates positioned downstream of the first array of magnets and positioned between rows of magnets of the first array of magnets;
a second array of magnets positioned downstream of the vertical deflection plates and comprised of pairs of permanent magnets defining a second magnetic field between the pairs of magnets;
second beamguide spacers positioned in between columns of the second array of magnets, wherein the second beamguide spacers comprise channels through which the beamlet array passes;
a second slit positioned downstream of the second array of magnets having a second resolution that permits passage of ions having the selected mass energy product and substantially blocks other ions having a non-selected mass energy product;
vertical deflection plates positioned downstream of the second slit and in between rows of the beamlet array that cause the beamlets within the array to diverge in a vertical direction; and
a drift region positioned downstream of the vertical deflection plates that cause the beamlets within the array to diverge in a horizontal direction and form into a single ion beam.

7. The system of claim 6, further comprising an end station comprising a target that is implanted by the single ion beam.

8. The system of claim 6, wherein the first magnetic field deflects the beamlet array by 45 degrees in a horizontal direction.

9. The system of claim 8, wherein the second magnetic field deflects the beamlet array by 45 degrees opposite the deflection of the first magnetic field.

10. A method for generating a low energy, high current ion beam comprising:
generating an array of beamlets;
performing a mass analysis on the array of beamlets that causes ions having a selected mass energy product to deflect at a first angle;
blocking other ions having a non-selected mass energy product;
diverging the array of beamlets in a horizontal direction and a vertical direction to form the low energy, high current ion beam; and
measuring beam current uniformity of the low energy, high current ion beam and adjusting beam current of individual beamlets of the array of beamlets according to the measured beam current uniformity.

11. A multi-channel ion implantation system comprising:
a beam source that generates a beamlet array, the beam source comprising: a plasma source, a power source, and a triode extraction assembly; and
a beamline assembly that comprises:
 a mass analyzer module that operates on the beamlet array to remove ions having a non-selected mass energy product; and
 a beam formation component that combines the beamlet array into a single ion beam.

12. A multi-channel ion implantation system comprising:
a beam source that generates a beamlet array; and
a beamline assembly that comprises:
 a mass analyzer module that operates on the beamlet array to remove ions having a non-selected mass energy product, the mass analyzer module comprising:
  a first array of magnets defining channels between pairs of magnets through which the beamlets travel subjected to magnetic fields, wherein the first array of magnets deflect the beamlet array by a first angle; and
  a second array of magnets defining channels between pairs of magnets through which the beamlets travel, wherein the second array of magnets deflect the beamlet array by a second angle; and a beam formation component that combines the beamlet array into a single ion beam.

13. The system of claim 12, wherein the second angle is opposite the first angle.

14. The system of claim 12, wherein the mass analyzer module further comprises horizontal partition plates positioned between the first array of magnets and the second array of magnets that block separating rows of that mitigate cross channel contamination.

15. The system of claim 14, wherein the horizontal partition plates further comprise electrodes associated with individual beamlets of the beamlet array.

16. The system of claim 15, wherein the electrodes are biased to generate an electric field across the individual beamlets.

17. A multi-channel ion implantation system comprising:
a beam source that generates a beamlet array; and
a beamline assembly that comprises:
 a mass analyzer module that operates on the beamlet array to remove ions having a non-selected mass energy product, the mass analyzer module comprising:
  a first array of magnets defining channels between pairs of magnets through which the beamlets travel subjected to magnetic fields, wherein the first array of magnets deflect the beamlet array by a first angle, wherein the first array of magnets includes beamguide spacers that physically separates columns of the magnets; and a beam formation component that combines the beamlet array into a single ion beam.

18. The system of claim 17, wherein the beamguide spacers have the channels formed therein.

19. The system of claim 18, wherein the channels formed within the beamguide spacers have a size and shape selected to substantially permit ions having the selected mass energy product to pass and substantially block ions having other mass energy products.

20. A multi-channel ion implantation system comprising:
a beam source that generates a beamlet array; and
a beamline assembly that comprises:
 a mass analyzer module that operates on the beamlet array to remove ions having a non-selected mass energy product;
 a beam formation component that combines the beamlet array into a single ion beam; and
 a beamline current adjustment module downstream of the mass analyzer module that is controllable to individually adjust beamlet currents of the beamlet array.

21. The system of claim 20, wherein the beamline current adjustment module comprises a number of horizontal plates positioned between rows of the beamlet array, wherein the number of horizontal plates comprise electrodes that controllably applies electric fields to the beamlet array.

22. The system of claim 21, further comprising a controller that controls the electric fields generated by the current adjustment module to obtain a desired beam current distribution.

23. A method for generating a low energy, high current ion beam comprising:
generating an array of beamlets;
performing a mass analysis on the array of beamlets that causes ions having a selected mass energy product to deflect at a first angle;
performing a second mass analysis on the array of beamlets that causes ions having a selected mass energy product to deflect at a second angle;
blocking other ions having a non-selected mass energy product; and
diverging the array of beamlets in a horizontal direction and a vertical direction to form the low energy, high current ion beam.

24. A method for generating a low energy, high current ion beam comprising:
generating an array of beamlets;
performing a mass analysis on the array of beamlets that causes ions having a selected mass energy product to deflect at a first angle;
blocking other ions having a non-selected mass energy product; and
diverging the array of beamlets in a horizontal direction and a vertical direction to form the low energy, high current ion beam; wherein diverging the array of beamlets in the horizontal direction comprises employing a drift region having a length selected to provide an amount of horizontal divergence.

25. The system of claim 20, further comprising an acceleration assembly positioned downstream of the vertical deflection plates that accelerates the beamlets to a selected energy.

* * * * *